United States Patent [19]

Fukuda et al.

[11] Patent Number: 4,945,226
[45] Date of Patent: Jul. 31, 1990

[54] SEMICONDUCTOR PHOTOSENSOR AND DRIVING METHOD THEREFOR

[75] Inventors: Takeshi Fukuda, Ebina; Nobumitsu Amachi, Atsugi; Mitsunori Sakama, Hiratsuka; Naoya Sakamoto, Atsugi; Shunpei Yamazaki, Tokyo, all of Japan

[73] Assignee: Semiconductor Energy Laboratory Co., Ltd., Atsugi, Japan

[21] Appl. No.: 263,367

[22] Filed: Oct. 27, 1988

[30] Foreign Application Priority Data

Oct. 28, 1987 [JP] Japan .................................. 62-274451

[51] Int. Cl.⁵ ............................................. H01J 40/14
[52] U.S. Cl. .................................. 250/214 R; 307/311
[58] Field of Search ............ 250/214 R, 206, 214 AL, 250/214 B; 307/311

[56] References Cited

U.S. PATENT DOCUMENTS 4,769,534 9/1988 Brand ............................... 250/214 R Primary Examiner—David C. Nelms
Attorney, Agent, or Firm—Sixbey, Friedman, Leedom & Ferguson

[57] ABSTRACT

A photosensing system is described. Light rays to be sensed is incident on a photosensitive semiconductor device which allows much current to pass therethrough during receiving the incident light and which passes a little current when there is no incident light. The current passing through the semiconductor device is accumulated in a suitable storage means. The accumulated charge is detected, in order to judge the existence or the absence of the incident light, a certain time period after the pulsed signal is outputted.

7 Claims, 4 Drawing Sheets

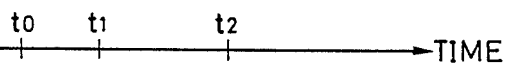
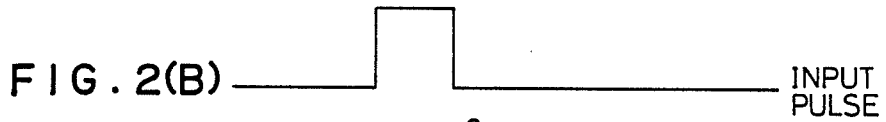
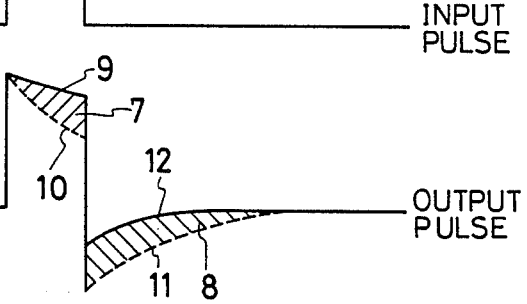
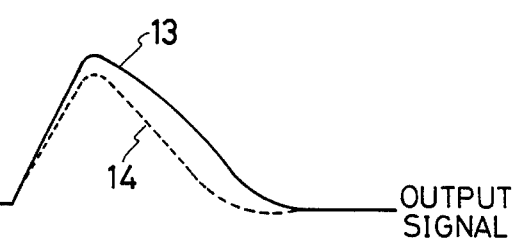

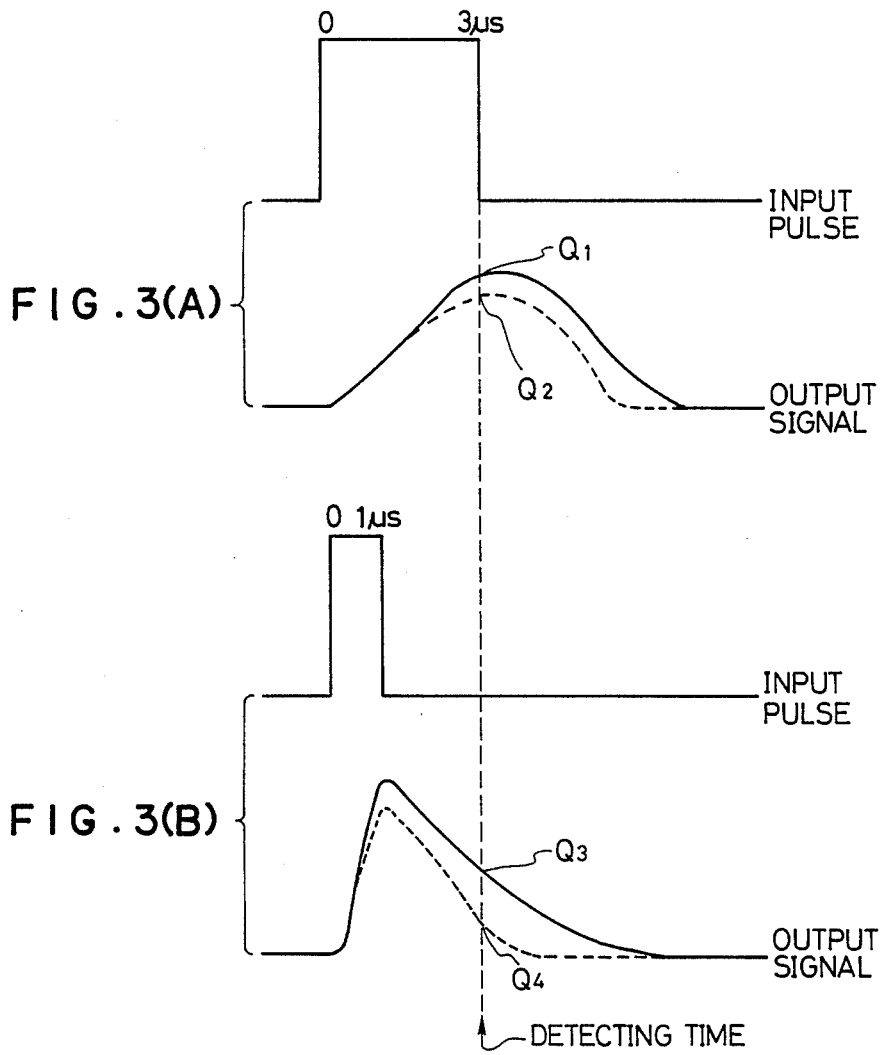

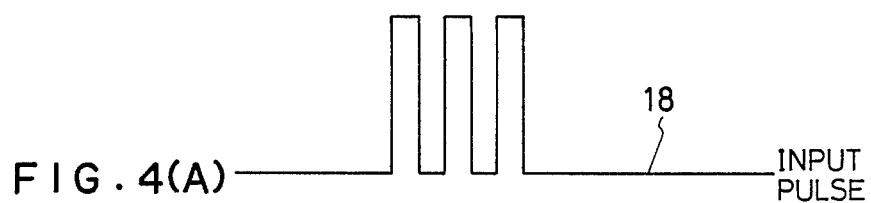
FIG. 4(A) — INPUT PULSE
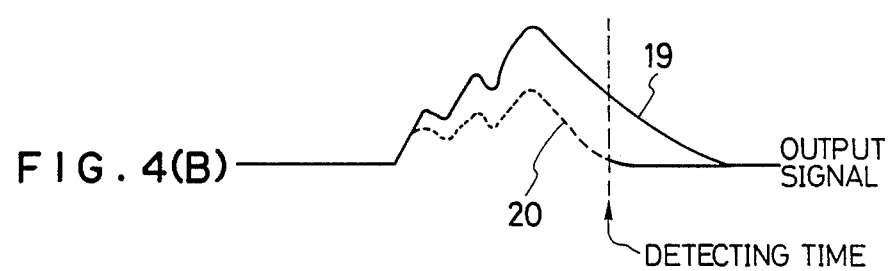
FIG. 4(B) — OUTPUT SIGNAL
DETECTING TIME

SEMICONDUCTOR PHOTOSENSOR AND DRIVING METHOD THEREFOR

BACKGROUND OF THE INVENTION

The present invention relates to a semiconductor photosensor and a driving method therefor.

The driving method of photosensors is sorted in three types, for example those as illustrated in FIGS. 1(A) to 1(C). In FIG. 1(A), the photosensing system comprises a photosensitive semiconductor device 1 arranged to receive light rays to be sensed, a pulse generator 4 which outputs pulsed signals to the semiconductor device 1, a resistor 2 through which the semiconductor device is earthed, an amplifier 3 inputting the pulsed signal from the semiconductor device 1 and a signal detector 5 receiving the output signal from the amplifier 3. The current level passing through the photosensor is amplified by the amplifier 3 and detected by the detector 5. The output signal levels which would be detected in the case when the semiconductor device is receiving light rays (bright condition) and in the case when the device is not receiving light rays (dark condition) are registered in the detector 5 in advance. The detector 5 carries out the judgement of whether incident light exists or not by comparing the registered level with the actual detected level. FIGS. 1(B) and 1(C) show modifications of the system of FIG. 1(A). Both modifications are based on the differential charge, between dark and bright conditions, accumulated in a capacitor 5 or a integration circuit associated with an I/V convertor 6. These are preferred since charge accumulation is less influenced by noise in comparison with the first type which is based on the current level and unstable due to the hole accumulation effect.

FIG. 2(C) shows the output signal responsive to an input pulse of FIG. 2(B). The solid lines 9 and 12 indicate the output signal in case of bright condition and the dashed lines 10 and 11 indicate the output signal in case of dark condition. However, because of the hole accumulation effect and ensuing reverse current, the light detection performance becomes unstable. Conventionally, some attempts to overcome this shortcoming have been proposed. For example, recombination centers are introduced and built up on the junction of the semiconductor device in order to trap photogenerated holes which tend to linger. Alternatively, the semiconductor region of the device is formed thicker than usual thicknesses so that holes are trapped during moving the elongated drift path to the collector electrode. However, these prior measures provide no basic solution.

SUMMARY OF THE INVENTION

Is is an object of the present invention to provide a photosensor which can be driven in a high stabilized operation.

In accordance with the present invention, the detection of charge whose amount is indicative of the existence or the absence of the incident light rays is carried out a certain time after the input signal level to the photosensitive semiconductor device of the photosensor is returned to the base level.

BRIEF DESCRIPTION OF THE DRAWINGS

FIGS. 2(A) to 2(D) are graphical diagrams showing timing relationship and waveforms among an input pulse, the responses thereto and the detected output signal.

FIGS. 3(A) and 3(B) are graphical diagrams showing the detection timing in accordance with prior art and the present invention.

FIGS. 4(A) and 4(B) are graphical diagrams showing an input signal and the response thereto and the detecting timing in accordance with another embodiment of the present invention.

DETAILED DESCRIPTION OF THE PREFERRED EMBODIMENTS

Figure 1A:
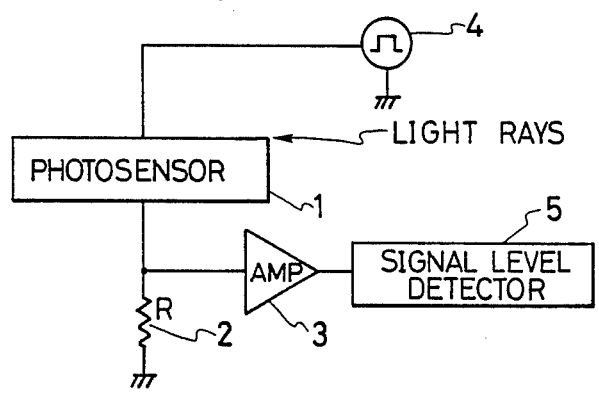
FIGS. 1(A), 1(B), and 1(C) are brock diagrams illustrating the circuits of three types of photosensors.
Figure 1B:
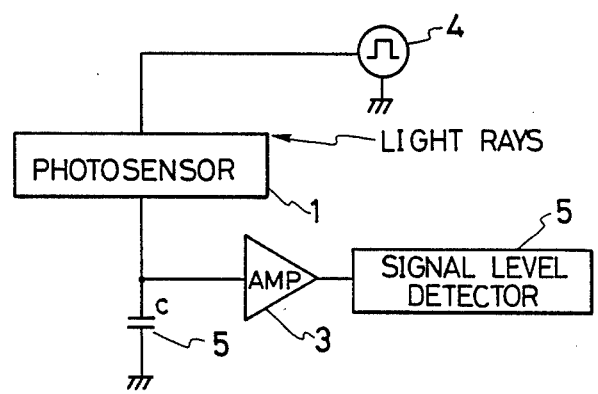
Figure 1C:
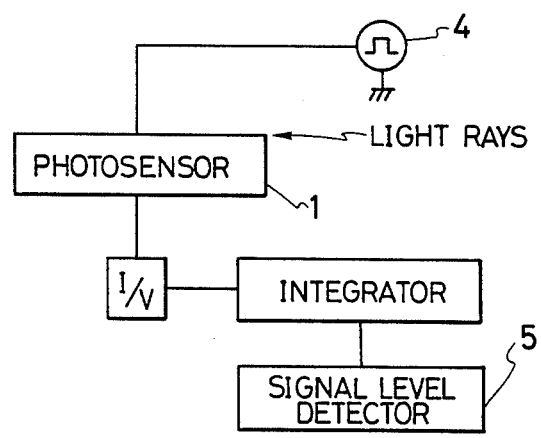

Hereinbelow, a preferred embodiment will be described. The photosensor of this embodiment is constructed same as illustrated in FIGS. 1(B) and 1(C). The characteristic feature of the present invention resides in the detecting timing at which the accumulated charge is detected.

Referring now to FIGS. 3(A) and 3(B), the relationship between an input pulsed signal having a pulse width of 3 microseconds and 1 microsecond and the accumulated charge associated therewith. The dashed straight line indicates the detecting time. FIG. 3(A) is provided, for reference, to show an prior art technique. In this figure, the accumulated charge is detected at the time point of 3 microseconds. $Q_1$ (on the solid curve) represents the detected charge in case of bright condiction and $Q_2$ (on the dashed curve) represents the detected charge in case of dark condition. The detector determines the existence or the absence of incident light rays on the basis of the differential charge between the two charges. The graphical diagrams of FIGS. 3(A) and 3(B) are drafted in accordance with experiments which were carried out by use of a photosentor comprising a photosensitive amorphous silicon semiconductor device having a NIN junction therein.

In accordance with the present invention, the detecting time is deferred for 2 microseconds from the edge of the pulse as shown in FIG. 3(B). In this embodiment, the deferment is established by making the pulse width shorter while the detecting time is not changed. The accumulated charge in case of the dark condition is rapidly discharged and remains very little at the detecting time. By contrast, the accumulated charge in the bright condition is gradually discharged in comparison with the case of the dark condition. For this reason, the difference between charge amounts in cases of bright and dark conditions becomes relatively large in comparison with the prior art timing depicted in FIG. 3(A). This phenomenon can be understood taking into account the hole accumulation effect. Referring again to FIG. 2(C), the differential charge corresponds to the dashed area 7 between the solid line 9 and the dashed line 10 and the dashed area 8 between the solid line 12 and the dashed line 11. Between $t_0$ and $t_1$, the accumulated charge in case of bright condition is much than that in case of dark condition because of photogenerated current equivalent to the dashed area 10 due to photogenerated current. Between $t_1$ and $t_2$, the accumulated charge is discharged by the amount equivalent to the negative component of the output pulse. The differential discharge amount corresponding to the dashed area 8 is attributed to the hole accumulation effect. The lingering holes then cancel out some portion of discharging carriers. Namely, the undesirable effect has an advantageous function, in this driving method, to make larger the difference between the bright condition and the dark condition.

Referring to FIGS. 4(A) and 4(B), another embodiment of the present invention will be described. In this embodiment, the input signal consists of a series of sequential pulses. For example, three pulses of 0.5 microseconds are inputted with intervals of 0.5 microseconds as shown in FIG. 4(A). The detecting time is 1.5 microseconds deferred form the edge of the last pulse. The output is as illustrated in FIG. 4(B). The differential charge is three-folded. Of course, the number of pulses contained in the series may be two or larger than three.

While several embodiments have been specifically described, it is to be appreciated that the present invention is not limited to the particular examples described and that modifications and variations can be made without departure from the scope of the invention as defined by the append claims.

What is claimed is:

1. A photosensor comprising:
    a pulse generator;
    a photosensitive semiconductor device coupled with said pulse generator in order to receive a pulsed signal from said pulse generator;
    a charge storage means for accumulating charge in correspondence with the current passing through said semiconductor device; and
    a signal level detector which detects charge accumulation level of said storage means a substantial time period, comparable to a discharge time of the charge storage means, after said semiconductor device receives the input pulse from said pulse generator in order to differentiate the charge accumulation levels corresponding to when said device is illuminated from that corresponding to when said device is not illuminated.

2. The photosensor of claim 1, wherein said time period is of the order of microseconds.

3. The photosensor of claim 1 wherein said charge storage means is a capacitor.

4. The photosensor means consists of an I/V converter and an integration circuit.

5. The photosensor of claim 1 wherein said input signal is a pulse.

6. The photosensor of claim 1 wherein said input signal consists of a series of pulses.

7. The photosensor of claim 1 wherein said photosensitive semiconductor device is made of amorphous silicon semiconductor.

* * * * *

UNITED STATES PATENT AND TRADEMARK OFFICE
CERTIFICATE OF CORRECTION

PATENT NO. : 4,945,226

DATED : July 31, 1990

INVENTOR(S) : Takeshi Fukada et al

It is certified that error appears in the above-identified patent and that said Letters Patent is hereby corrected as shown below:

ON TITLE PAGE:

[75] Inventors: Takeshi Fukada, Ebina; Nobumitsu Amachi, Atsugi; Mitsunori Sakama, Hiratsuka; Naoya Sakamoto, Atsugi; Shunpei Yamazaki, Tokyo, all of Japan Signed and Sealed this Tenth Day of March, 1992

Attest:

HARRY F. MANBECK, JR.

*Attesting Officer*     *Commissioner of Patents and Trademarks*